US007872275B2

(12) United States Patent
Diamantidis

(10) Patent No.: US 7,872,275 B2
(45) Date of Patent: Jan. 18, 2011

(54) LIGHT-EMITTING DIODE ARRANGEMENT

(75) Inventor: Georg Diamantidis, Dernbach (DE)

(73) Assignee: Noctron Holding S.A., Bridel (LU)

( * ) Notice: Subject to any disclaimer, the term of this patent is extended or adjusted under 35 U.S.C. 154(b) by 404 days.

(21) Appl. No.: 11/442,672

(22) Filed: May 26, 2006

(65) Prior Publication Data

US 2006/0267032 A1 Nov. 30, 2006

(30) Foreign Application Priority Data

May 27, 2005 (DE) .................. 10 2005 024 830

(51) Int. Cl.
*H01L 33/08* (2010.01)

(52) U.S. Cl. .......................... 257/99; 257/94

(58) Field of Classification Search ............... 257/94, 257/95, 99, 100
See application file for complete search history.

(56) References Cited

U.S. PATENT DOCUMENTS

| 6,294,800 | B1 * | 9/2001 | Duggal et al. ............ 257/89 |
| 6,906,459 | B2 * | 6/2005 | Suehiro et al. ............ 313/512 |
| 2004/0252501 | A1 * | 12/2004 | Moriyama et al. .......... 362/238 |
| 2005/0068777 | A1 | 3/2005 | Popovic |

FOREIGN PATENT DOCUMENTS

| DE | 1948034 | 11/1970 |
| DE | 2920444 C2 | 1/1982 |

* cited by examiner

*Primary Examiner*—Thao X Le
*Assistant Examiner*—Tanika Warrior
(74) *Attorney, Agent, or Firm*—Factor & Lake, Ltd.

(57) ABSTRACT

A light-emitting diode arrangement includes one or more LED crystal pieces that are mechanically held by leads and connecting lines.

20 Claims, 9 Drawing Sheets

LIGHT-EMITTING DIODE ARRANGEMENT

CROSS-REFERENCE TO RELATED APPLICATIONS

This application claims priority of German Patent Application DE 10 2005 024 830.6, filed May 27, 2005. The full disclosure of this application is incorporated herein by reference.

BACKGROUND OF THE INVENTION

The present invention is directed to a light-emitting diode configuration, and more particularly, to a light-emitting diode configuration including an LED crystal piece and operativley connected to a voltage source.

Individual light-emitting diodes are known both in conventional connection technology with connecting lugs and in surface mounted technology.

They are respectively adjacent to a circuit board on one of their main surfaces, and are contained in small packages which transmit light only on one side.

Solder, which lies on the circuit board side of the bounding surface of the LED crystal piece of a light-emitting diode, also prevents light from emerging at this position.

It is therefore an object of the present invention to overcome these and other issues associated with light-emitting diodes in conventional connection and surface mounted technologies. These and other objects will become apparent to one of ordinary skill in the art in light of the specification, claims, and drawings appended hereto.

SUMMARY OF THE INVENTION

The present invention is directed to a light-emitting diode arrangement having at least one LED crystal piece wherein two leads are operatively connected to each respective LED crystal piece and further coupled to a voltage source. A crystal support device carries the LED crystal pieces in such a way that their bounding surfaces are free at least in the vicinity of the light-emitting crystal region.

It is an object of the present invention to provide a light-emitting diode arrangement having improved luminous efficiency.

In the light-emitting diode arrangement according to the present invention, the LED crystal piece is held substantially freestanding by a support device. Apart from very small contacting/fastening regions, light can therefore emerge from all bounding surfaces of the LED crystal piece.

The present invention not only achieves a higher luminous efficiency, but less heat generation and better thermal dissipation are also obtained.

By an appropriate design in a light-emitting diode arrangement according to the present invention, the electrical leads also serve as a mechanical support device for the LED crystal pieces.

In a light-emitting diode arrangement according to the present invention, the LED crystal pieces are held at their edges. This allows the electrical leads to the LED crystal pieces to be selected with a very small diameter, since they do not need to fulfil any mechanical function. In turn, therefore, the electrical leads do not cause any shadowing.

The present invention provides an extended light source with a substantially homogeneous intensity distribution.

The present invention provides a light-emitting diode arrangement that emits light equally distributed in a predetermined solid angle range.

In a light-emitting diode arrangement according to the present invention, the LED crystal pieces are protected against environmental influences.

In a light-emitting diode arrangement according to the present invention, the LED crystal pieces can also be operated at high temperatures without incurring any deterioration of their working properties.

In one embodiment of the present invention, the light-emitting diode arrangement has good thermal dissipation from the LED crystal pieces, particularly when the package is filled with a light noble gas such as helium.

In one embodiment of the present invention, a particular configuration is advantageous in respect of equal orientation of the various LED crystal pieces.

In another embodiment of the present invention, a particular configuration is advantageous in respect of good optical transmission through the package and straightforward production.

In yet another embodiment of the present invention, a particular configuration is advantageous in that it is possible to focus or diverge light emitted by the light-emitting diode arrangement.

In still another embodiment of the present invention, a particular configuration is advantageous in that light emitted by a light-emitting diode is not shadowed by a neighboring light-emitting diode. Rather, this light is deviated into a direction in which there are no other LED crystal pieces.

Mirror surfaces, as specified in the present invention, can be produced in a particularly straightforward way and ensure good deviation of the light emitted by the LED crystal pieces in a direction perpendicular to the axis of the light-emitting diode arrangement.

In a further embodiment of the present invention, a particular configuration is advantageous in respect of straightforward mounting of the light surfaces and in respect of uniform deviation of the light rays emerging from the footprints of the LED crystal pieces.

In a still further embodiment of the present invention, a particular configuration is advantageous in respect of straightforward and reliable positioning of the mirror surfaces together with the LED crystal pieces.

In yet a further embodiment of the present invention, a particular configuration is advantageous in respect of particularly straightforward contacting of the various LED crystal pieces. The effect achieved by this is that the support device hinders the emission of light only to a small extent.

In yet another further embodiment of the present invention, a particular configuration is advantageous in respect of straightforward contacting of the LED crystal pieces.

Crystal pieces as specified in the present invention can be produced in a particularly straightforward way and require only little material.

In this context, another embodiment of the present invention is distinguished by a particularly high luminous efficiency and a spectral response of the light-emitting diode arrangement which is favourable for application purposes. An MQW (multi quantum well) layer constitutes a kind of superlattice which ensures broadening of the emission spectrum.

In a light-emitting diode arrangement according to the present invention, no significant shadowing of the emitted light by neighbouring LED crystal pieces takes place.

BRIEF DESCRIPTION OF THE DRAWINGS

The invention will be explained in more detail below with of the aid of exemplary embodiments with reference to the drawing, in which.

DETAILED DESCRIPTION OF THE PRESENT INVENTION

Figure 1:
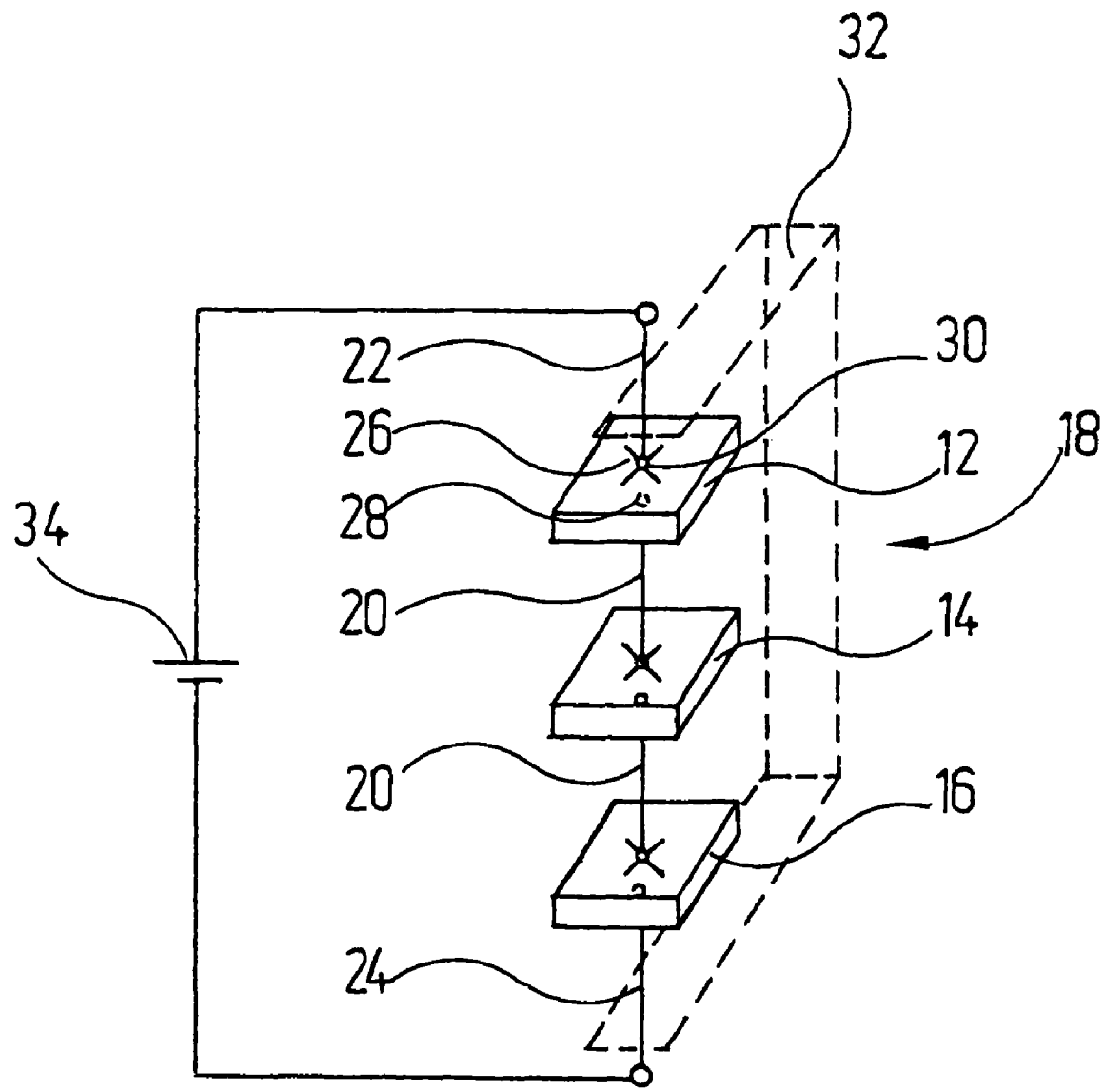
FIG. 1 shows a light-emitting diode arrangement which comprises three LED crystal pieces held and supplied with voltage by cable pieces.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

FIG. 1 shows three LED crystal pieces 12, 14, 16, which respectively have the shape of flat plates with a square edge contour.

Each of the LED crystals is cut from an appropriately doped wafer, which comprises a p-doped sublayer and an n-doped sublayer, so that light is obtained by recombination of electrons and holes at the p-n junction obtained in this way.

In order to ensure that light emerging in any direction from the LED crystal pieces 12, 14, 16 is available for use, the LED crystal pieces 12, 14, 16 are held by a support device, denoted overall by 18, so that their bounding surfaces are substantially free.

To this end, the LED crystal pieces 12, 14, 16 are connected to one another by connecting conductors 20, and the marginal LED crystal pieces 12, 16 are respectively provided with a lead 22 or 24 on their outside.

The connecting conductors 20 and the leads 22, 24 may in practice be made of the same material. They may, for example, be copper or silver wire pieces, braids, or copper or silver cables, or thin rods of copper or silver. Other pure or alloyed materials with good electrical conductivity, from which the connecting conductors 20 and the leads 22, 24 may be made, are known to the person skilled in the art.

The connection of the connecting conductors 20 or leads 20, 22 to the LED crystal pieces 12, 14, 16 is carried out by solderings 26, 28 which are provided in the middle of the upper side or lower side of the LED crystal pieces. These solderings are designed so that the solder remains restricted to a substantially circular surface 30, which has only a small diameter compared with the edge lengths of the LED crystal pieces 12, 14, 16.

The entire arrangement shown in FIG. 1 is carried by a U-shaped frame 32 of insulating material which is in turn applied (in a way which will not be described in further detail) on a device package, a circuit board or the like.

In the operating state, the leads 22, 24 are connected to a DC voltage source 34.

It can be seen from the description above that the light-emitting diode arrangement according to the present invention has a very straightforward mechanical structure, since the same components are used for the electrical supply and the mechanical holding of the LED crystal pieces. The LED crystal pieces 12, 14, 16 are held so that their bounding surfaces are almost entirely free.

In the exemplary embodiment according to FIG. 2, components which have already been described with reference to FIG. 1 are once more provided with the same reference numerals and will not be described again in detail below.

Instead of the frame 32, a package 36 made of glass is used for holding the LED crystal pieces 12, 14, 16. It is made of an extruded glass material which has a circular external contour and a square internal cross section. The square interior 38 created by the package 36 is dimensioned so that it corresponds to the edge contour of the LED crystal pieces 12, 14, 16, so that they are oriented in an angular direction in the interior 38, i.e., they cannot rotate relative to the arrangement's axis dictated by the leads 22, 24 and the connecting conductors 20.

The leads 22, 24 are fused into closure plugs 40, 42 which hermetically close the upper and lower ends of the interior 28.

Figure 2:
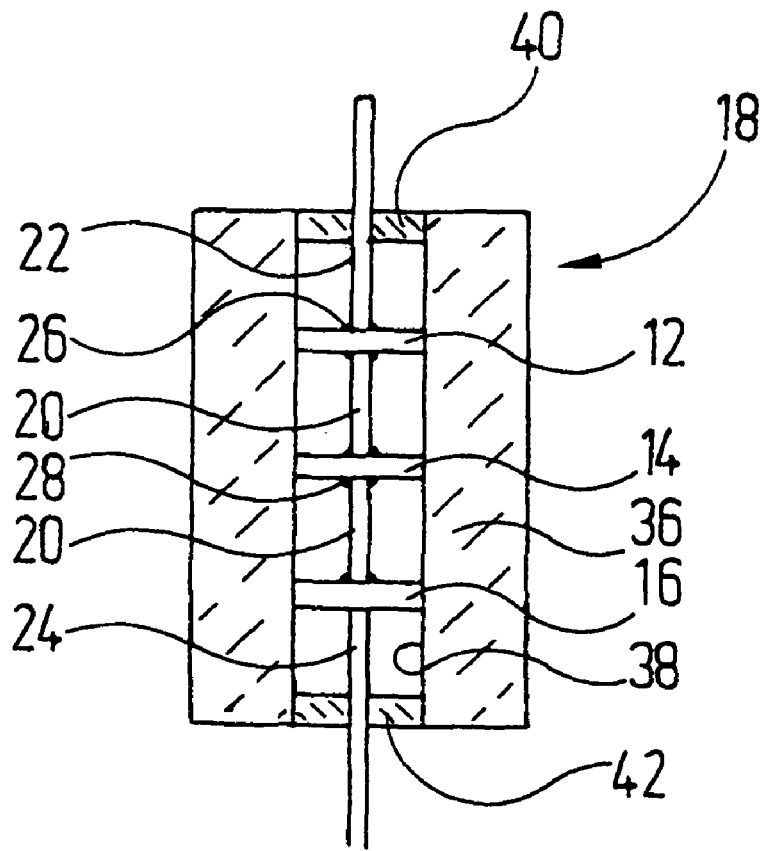
FIG. 2 shows a similar view as FIG. 1, the light-emitting diode arrangement being fitted in a package made of glass.

The frame 32 can therefore be obviated in the exemplary embodiment according to FIG. 2, since the package 36 holds the leads 22, 24.

The aforementioned external and internal shape of the package 36 not only provides angular alignment of the LED crystal pieces 12, 14, 16, but also achieves a lens effect due to four planoconvex cylindrical lenses which are formed by the package 36.

If such a lens effect is not desired, then the package 36 may also be designed as a sleeve with a square cross section, i.e., the package sections lying in front of the side surfaces of the LED crystal pieces 12, 14, 16 then remain plane-parallel plates with no imaging effect.

Figure 4:
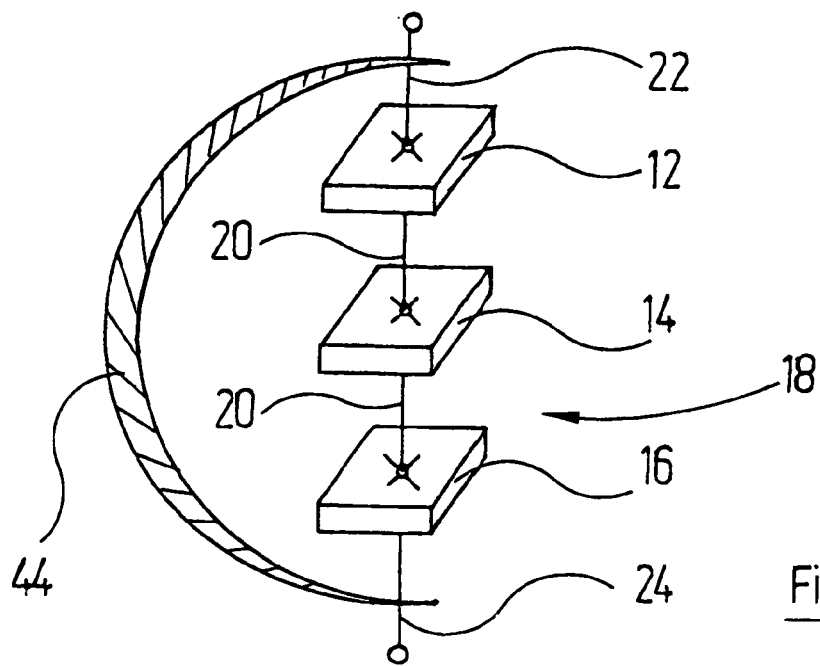
FIG. 4 shows a similar view as FIG. 1, the light-emitting diode arrangement being arranged in front of a concavely curved mirror.

FIG. 4 shows a light-emitting diode arrangement as was described with reference to FIG. 1. In the exemplary embodiment according to FIG. 4, however, the frame 32 is designed as a concavely curved mirror 44. An optical effect is thus once more obtained, by which the light emitted by the LED crystal pieces 12, 14, 16 is focused.

Figure 3:
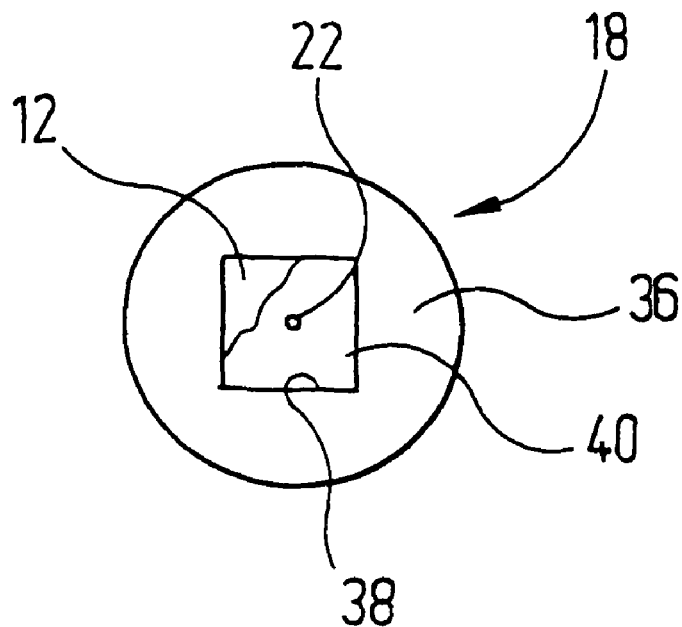
FIG. 3 shows a plan view of the light-emitting diode arrangement according to FIG. 2.
Figure 5:
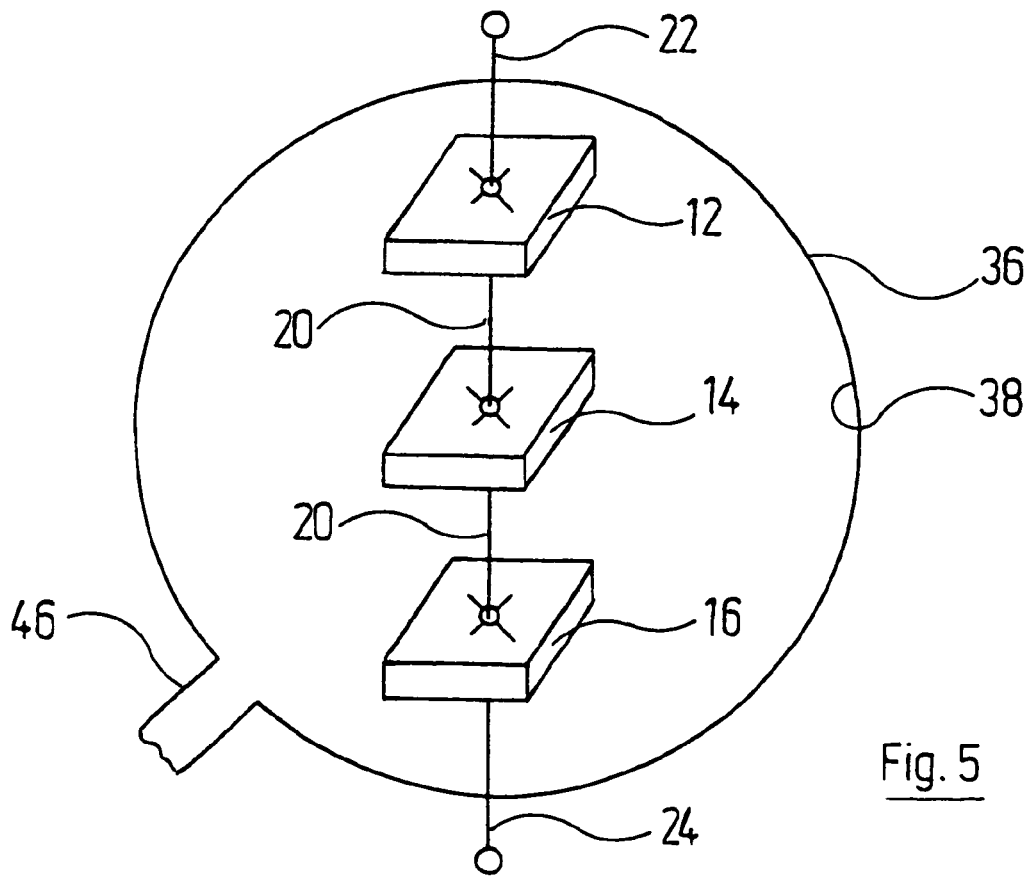
FIG. 5 shows a similar view as FIG. 2, although the package which encloses the light-emitting diode arrangement is designed spherically.

The exemplary embodiment according to FIG. 5 corresponds substantially to that according to FIGS. 2 and 3, except that the package 36 is designed as a sphere. The leads 22, 24 are once more respectively fused into it. A gland 46, via which the interior of the package 36 can be evacuated and optionally filled with an inert gas, is additionally shown in the package 36. After evacuating the interior of the sphere and optionally filling it with an inert gas, the gland 46 is fused so that the atmosphere inside the package 36 is kept unchanged.

Figure 6:
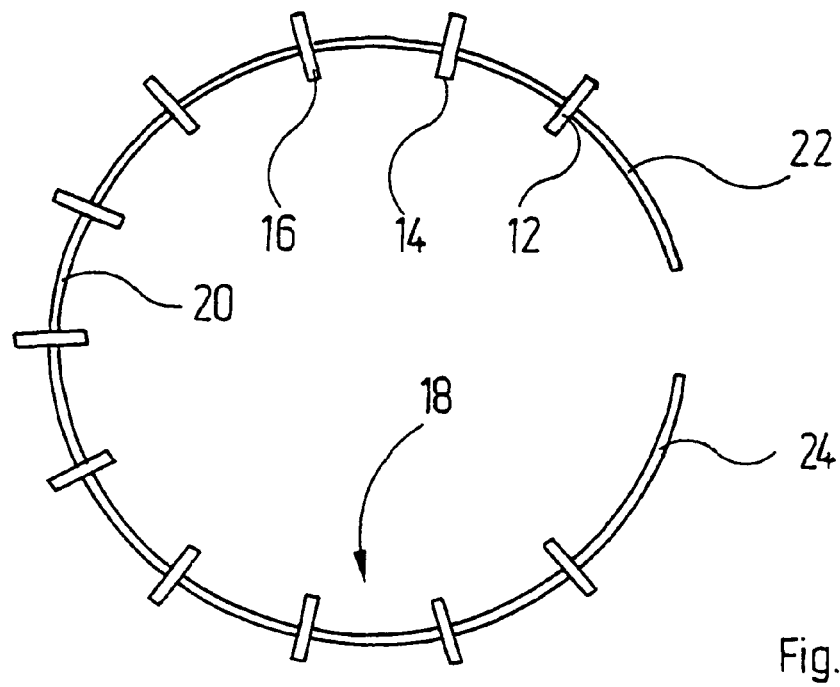
FIG. 6 shows a plan view of a light-emitting diode arrangement in the form of a circle arc.

In the exemplary embodiment according to FIG. 6, the LED crystal pieces 12, 14, 16 etc., are held by connecting conductors 20 and leads 22, 24, which consist of flexurally stiff wire pieces. The effect which can be achieved by this is that successive ones of the LED crystal pieces 12, 14, 16 are mutually tilted by an equal angle.

An overall emission characteristic of the light-emitting diode arrangement is therefore obtained which is rendered uniform in the plane of the light-emitting diode arrangement.

It should be understood that as a variant of the exemplary embodiment according to FIG. 6, it is possible to provide even more LED crystal pieces so that the overall light-emitting diode arrangement forms a circle, in which case the leads 22, 24 extend in a radial direction away from the circle next to one another.

Figure 7:
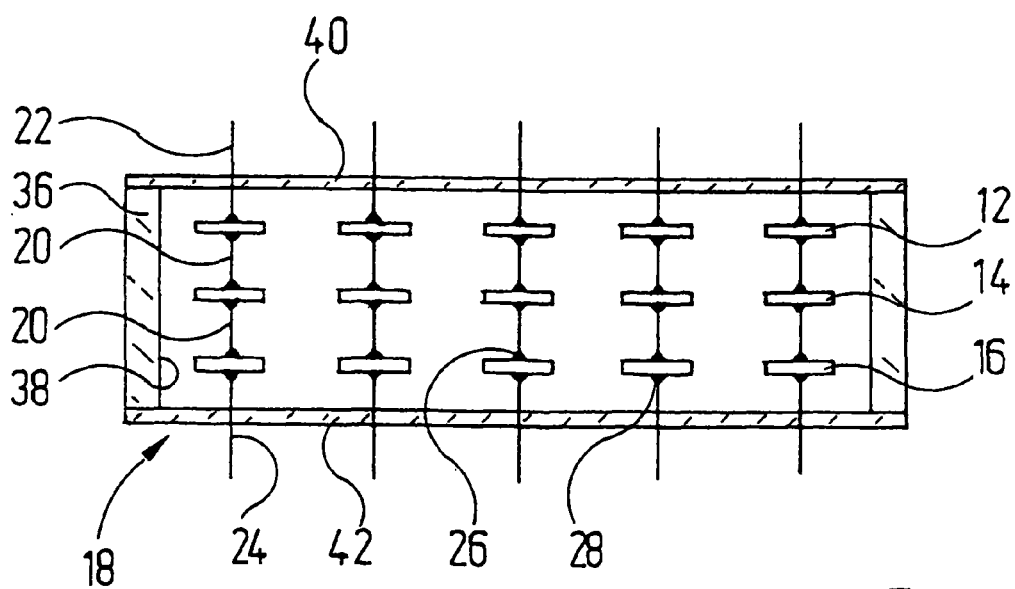
FIG. 7 shows an axial section through a three-dimensional light-emitting diode arrangement, which is arranged in a package shaped as a circular box.

In the exemplary embodiment according to FIG. 7, a package 36 has the shape of a cylindrical box with plane-parallel cover plates 40, 42. It now holds a multiplicity of LED crystal pieces 12, 14, 16, which are respectively held by connecting conductors 20 and leads 22, 24. The overall arrangement thus forms an extended light source with a substantially constant intensity distribution.

In another variant of the invention, it is also possible to produce other spatial arrangements of the units formed by LED crystal pieces, connecting conductors and leads, for example by using a cuboid transparent package and installing the axes of the individual light-emitting diode arrangements, dictated by the connecting conductors 20 and leads 22, 24, into the cuboid package differently in the x direction, y direction, and z direction. A light source which has a highly spherical intensity distribution is thus obtained overall.

Figure 8:
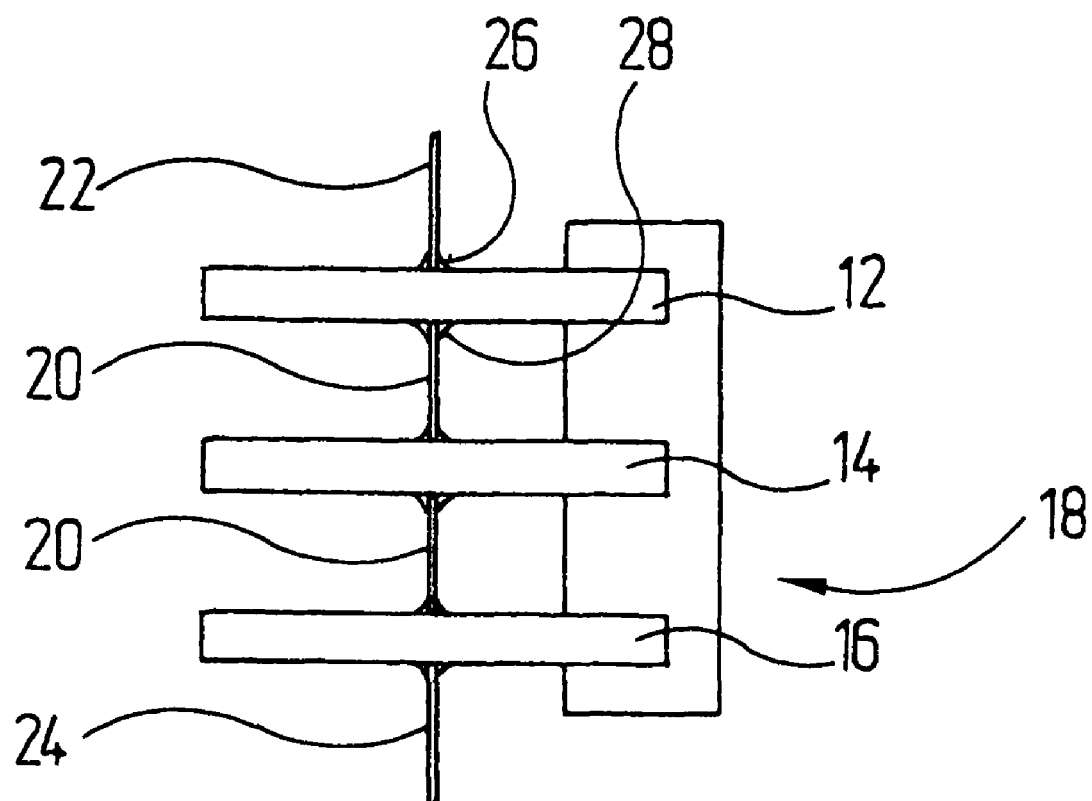
FIG. 8 shows a similar view as FIG. 1, although the LED crystal pieces are held by a rake-like support element.
Figure 9:
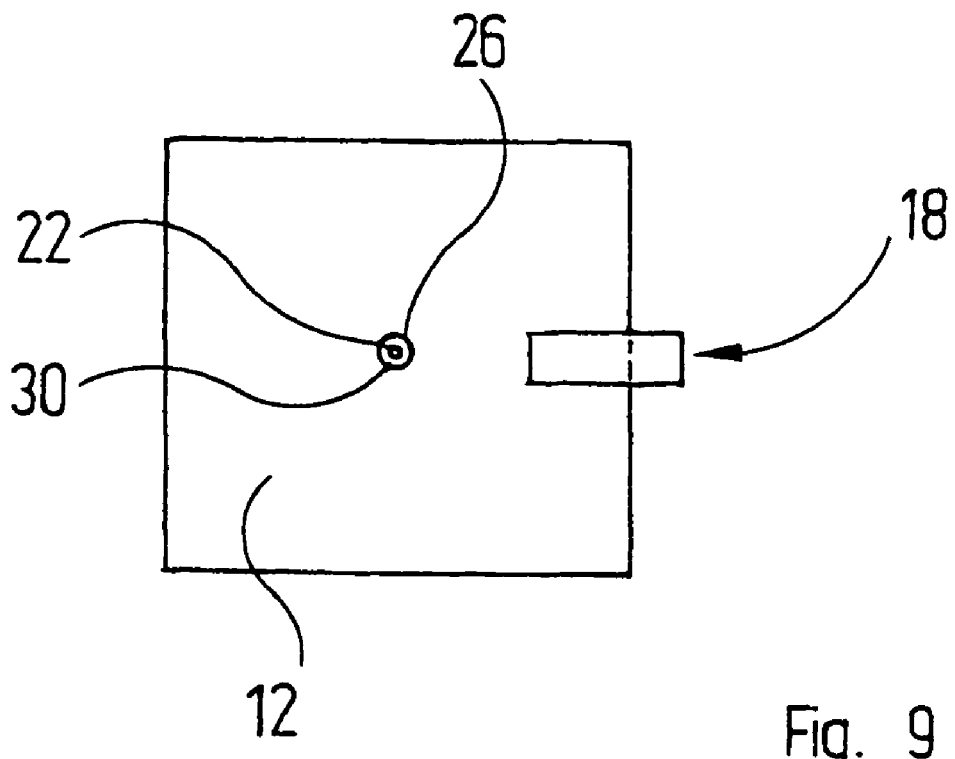
FIG. 9 shows a plan view of the arrangement according to FIG. 8.

In the exemplary embodiment according to FIGS. 8 and 9, the support device 18 is designed similarly to a rake, and the LED crystal pieces 12, 14, 16 are accommodated in the intermediate spaces that lie between the prongs of the rake. There, they may be held by a press fit or applied using a glass frit or an adhesive.

The prongs of the support device 18 are precisely as long as is necessary for secure holding of the LED crystal pieces 12, 14, 16. For this reason, the bounding surfaces of the crystal pieces are substantially free in the exemplary embodiment according to FIGS. 8 and 9 as well.

In practice, the support device 18 may be a shaped glass part or a shaped plastic part, the width of which is about one fifth to one third of the edge length of the LED crystal pieces.

As a variant of the exemplary embodiment according to FIGS. 8 and 9, the rake-like support device 18 may also be selected in the shape of a circle arc or in the shape of a ring, so that the advantages of angular equidistribution of the intensity output by the light-emitting diode arrangement are once more obtained.

Figure 10:
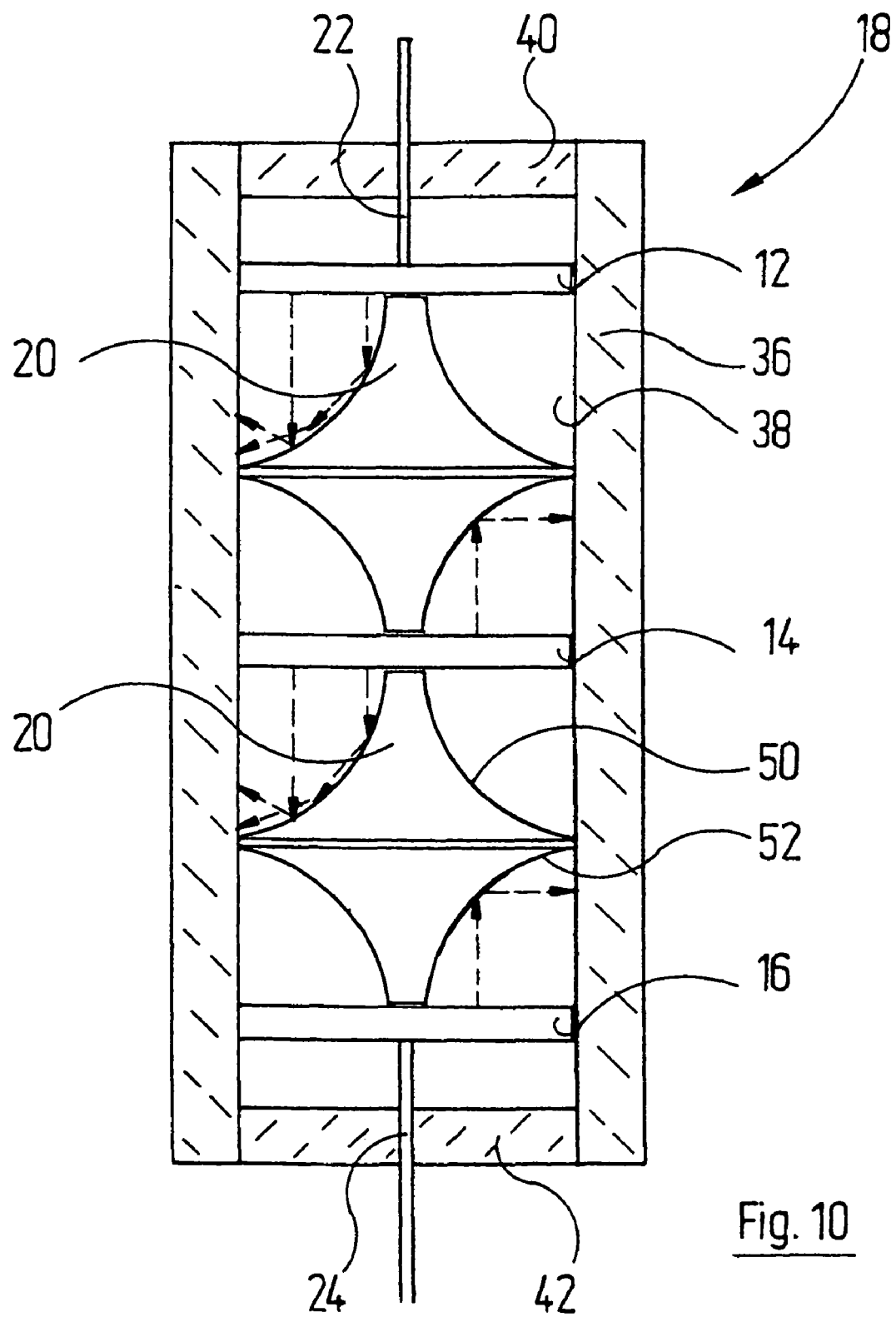
FIG. 10 shows a similar view as FIG. 2, although internal connecting conductors are designed as double mirror bodies.
Figure 11:
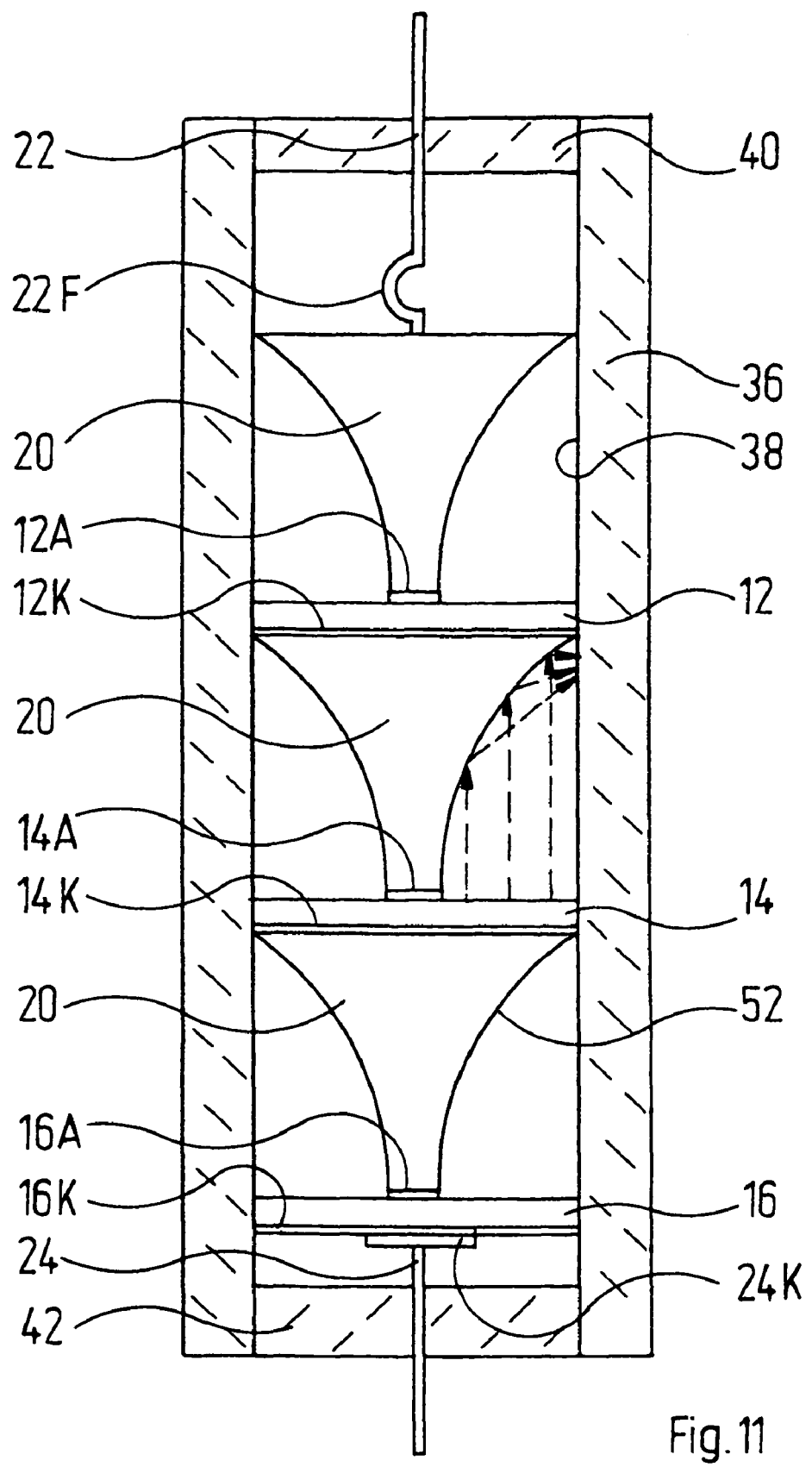
FIG. 11 shows a similar view as FIG. 10, although internal connecting conductors are designed as single mirror bodies.
Figure 12:
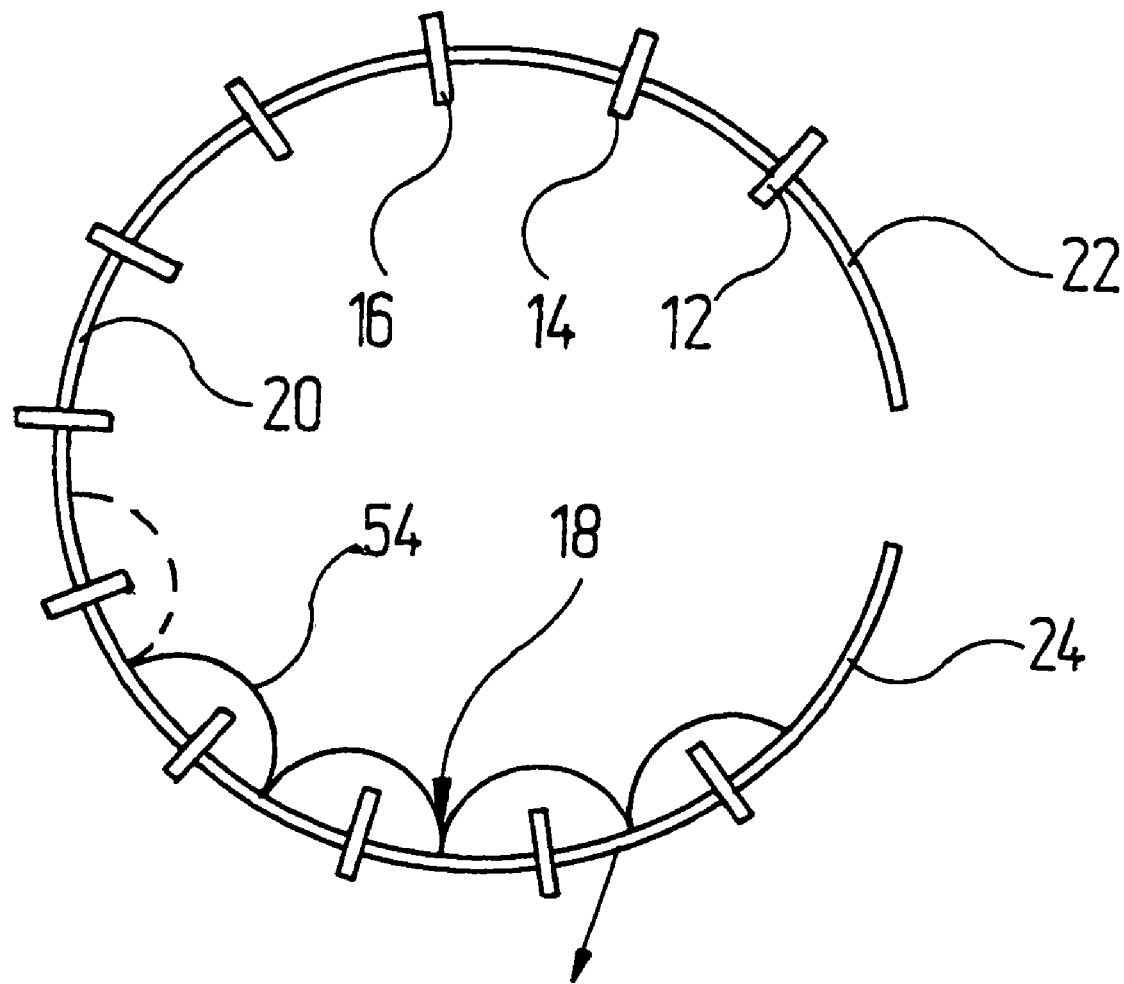
FIG. 12 shows a similar view as FIG. 6, but in which mirror bodies are provided on the insides of LED crystal pieces; and, FIG. 13 shows a plan view of a part of a modified light-emitting diode arrangement having a plurality of LED crystal pieces, which are successively arranged perpendicularly to the plane of the drawing and are held by a support device provided at the edges.

In the exemplary embodiments according to FIGS. 10 to 12, components which have already been described above in a functionally equivalent form in conjunction with other light-emitting diode arrangements are once more provided with the same reference numerals. These components will not be described again in detail below. The embodiments according to FIGS. 10 to 12 are distinguished in that in the vicinity of the light-emitting diodes, mirror bodies are provided which have rotationally symmetric mirror surfaces whose axes are substantially flush with the connecting line of successive light-emitting diodes.

In the exemplary embodiment according to FIG. 10, the connecting conductors 20 extending between neighbouring light-emitting diodes 12, 14, 16 are designed as electrical conductors having rotationally symmetric mirror surfaces. Additionally, the connecting conductor 20 has two rotationally symmetric mirror surfaces 50, 52 which adjoin each other via their wide base surfaces and each of which constitutes a part of a hyperboloid of revolution.

In this way, light which emerges from the end surfaces of the light-emitting diodes 12, 14 etc. is radiated in a substantially radial direction by the two mirror surfaces 50, 52.

In the exemplary embodiment according to FIG. 10, the common base surface of the two mirror surfaces 50, 52 has substantially the same diameter and the same edge contour as the LED crystal pieces 12, 14, 16 and is therefore likewise accommodated with a form fit in the interior 38 of the package 36.

The end surfaces of the hyperboloid connecting conductors 20 may be soldered to the end surfaces of the neighbouring LED crystal pieces.

As a variant, however, the entire stack of LED crystal pieces 12, 14, 16 and the hyperboloid connecting conductors 20 interposed between them may also be placed under an elastic prestress, for example by one or two resilient contacts which engage on the stack ends and are held by the package 36.

Such a light-emitting diode arrangement is shown in FIG. 11. There, the connection conductor 22 has a clip spring-like semicircular spring section 22F and the connection conductor 24 has a contact plate 24K.

Anode contacts of the LED crystal pieces 12, 14, 16 are furthermore denoted by 12A, 14A, 16A in FIG. 11, and cathode contacts by 12K, 14K, 16K.

The exemplary embodiment according to FIG. 11 is in other regards similar to that of FIG. 10, except that connecting conductors 20 which are designed as single paraboloid-of-revolution mirror surfaces are formed between the successive LED crystal pieces 12, 14, 16.

This arrangement is used in conjunction with those LED crystal pieces which emit light only towards one side. Many commercially available LED crystal pieces emit light only in the region of the anode, while the cathode side is not transmissive for light.

In the exemplary embodiment according to FIG. 12, bowl-shaped mirror bodies 54 which respectively have the shape of ellipsoids of revolution are fitted onto the connecting conductors 20. Light which is emitted in a radially inward direction by the LED crystal pieces 12, 14, 16 etc., is deviated into a radially outward direction by these mirror bodies 54.

The mirror bodies 54 may also be designed as a continuous chain. They may also have the shape of a prismatic mirror body with a constant cross section in the axial direction (parabolic channelling).

The light-emitting diode arrangement according to FIG. 12 thus generates a disc-shaped light fixture.

Figure 13:
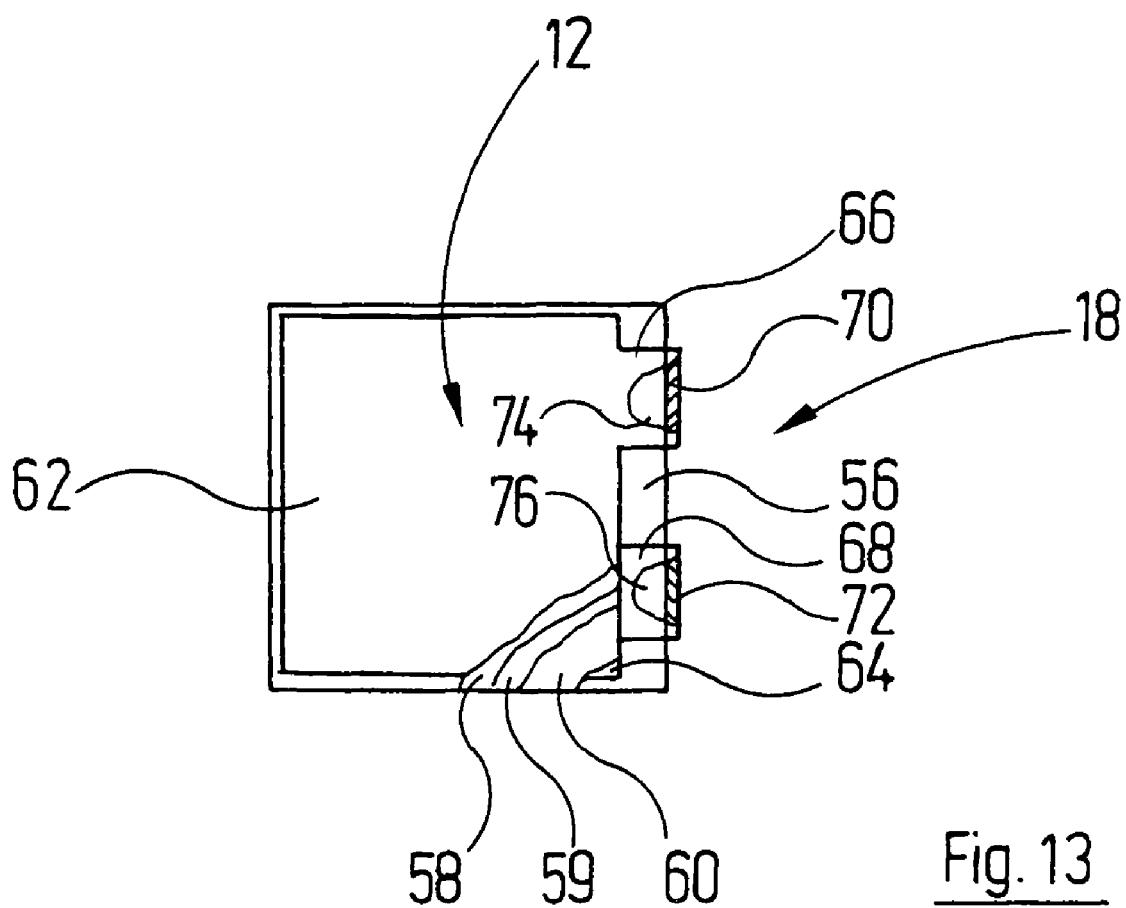

In the further exemplary embodiment shown FIG. 13, the LED crystal pieces 12 are formed by composite bodies. They are connected to the support device 18 by their edge on the right in FIG. 13.

The LED crystal pieces 12 comprise a square plane-parallel substrate plate 56 which is made of a transparent glass, in particular sapphire glass. The substrate glass 56 carries a multilayer structure, which comprises the following layers: a p-type conducting layer 58, an MQW layer 59 lying behind it, and an n-type conducting layer 60. A first electrode layer 62 is provided on the upper side of the p-type conducting layer 58, whereas the lower side of the n-type conducting layer is connected flatly to a second electrode layer 64 that is carried by the surface of the substrate 56.

In their section lying on the right in FIG. 13, the electrode layers 62, 64 have connecting lugs 66, 68 which, as shown, are mutually offset.

The support device 18 comprises two connection bands 70, 72 with a rectangular cross section, which is flat, but so large that the connection bands 70, 72 are freestanding. The connection band 70 is connected to the electrode layer 62 via a solder point 74, whereas the connection band 72 is connected to the electrode layer 60 via a solder point 76.

The layers 58, 59, 60, 62, and 64 are so thin that the entire multilayer structure is transmissive for light, which is generated by recombination of electrons and holes in the layer structure 58, 59, 60.

In the way shown in FIG. 13, a multiplicity of standard LED crystal pieces can readily be connected mechanically to form a row, and also electrically contacted.

It should be emphasized that the above-described embodiments of the present invention, particularly, any "preferred" embodiments, are possible examples of implementations merely set forth for a clear understanding of the principles of the present invention. Many variations and modifications may be made to the above-described embodiments of the present invention without substantially departing from the spirit and principles of the present invention. All such modifications are intended to be included herein within the scope of this disclosure and the present invention, and protected by the following claims.

What is claimed is:

1. Light-emitting diode arrangement having at least two LED crystal pieces and respectively including two leads for each of the at least two LED crystal pieces, via which the at least two LED crystal pieces can be connected to a voltage source, wherein a crystal support device is provided that carries the at least two LED crystal pieces substantially freestanding in such a way that bounding surfaces of the at least two LED crystal pieces are free and, apart from very small contacting/fastening regions, light can emerge from all bounding surfaces of the at least two LED crystal pieces, and wherein the at least two LED crystal pieces have a substantially parallel alignment on the crystal support device.

2. Light-emitting diode arrangement according to claim 1, wherein the crystal support device comprises the leads, which are designed as cable pieces, wire pieces, or thin rods.

3. Light-emitting diode arrangement according to claim 1, wherein the crystal support device is a rigid body having substantially the shape of a rake with prongs, which cooperates with the circumferential edges of the LED crystal pieces.

4. Light-emitting diode arrangement according to claim 1, wherein the crystal support device carries the at least two LED crystal pieces with a regular mutual spacing.

5. Light-emitting diode arrangement according to claim 1, wherein the crystal support device carries the at least two LED crystal pieces with a uniform relative tilt of successive LED crystal pieces.

6. Light-emitting diode arrangement according to claim 1, wherein the at least two LED crystal pieces and the crystal support device are arranged in a transparent package.

7. Light-emitting diode arrangement according to claim 6, wherein the package is evacuated.

8. Light-emitting diode arrangement according to claim 6, wherein the package is filled with an inert gas.

9. Light-emitting diode arrangement according to claim 6, wherein the internal cross section of the package is adapted to the external contour of the at least two LED crystal pieces.

10. Light-emitting diode arrangement according claim 6, wherein the package is made of colourless glass or colourless plastic material.

11. Light-emitting diode arrangement according to claim 1, wherein the at least two LED crystal pieces are arranged behind dispersive optics or in front of refractive optics.

12. Light-emitting diode arrangement according to claim 1, wherein mirror surfaces are arranged in the vicinity of the at least two LED crystal pieces.

13. Light-emitting diode arrangement according to claim 12, wherein the minor surfaces are surfaces of revolution, in particular hyperboloids of revolution, paraboloids of revolution, and ellipsoids of revolution.

14. Light-emitting diode arrangement according to claim 12, wherein the axes of the mirror surfaces of revolution are substantially flush with the connecting lines of successive LED crystal pieces.

15. Light-emitting diode arrangement according to claim 12, wherein the edge contour of connecting conductors designed as mirror surfaces corresponds to the edge contour of the at least two LED crystal pieces, and the mirror surfaces are thus positioned with a form fit in a package which holds the at least two LED crystal pieces.

16. Light-emitting diode arrangement according to claim 1, wherein the support device is provided at the edge of the at least two LED crystal pieces.

17. Light-emitting diode arrangement according to claim 16, wherein the support device comprises two leads having a rectangular cross section, which are routed in an insulating fashion over the edges of the at least two LED crystal pieces and which are respectively connected to one of two leads.

18. Light-emitting diode arrangement according to claim 1, wherein the at least two LED crystal pieces have an insulating substrate, which comprises a p-type conducting layer, an n-type conducting layer, and electrodes contacting these layers.

19. Light-emitting diode arrangement according to claim 18, wherein an MQW layer is provided between the p-type conducting layer and the n-type conducting layer.

20. Light-emitting diode arrangement according to claim 18, wherein the insulating substrate and the layers carried by it are at least partially substantially transmissive for emitted light.

* * * * *